United States Patent [19]
Zemel

[11] Patent Number: 5,900,096
[45] Date of Patent: May 4, 1999

[54] METHOD OF TRANSFERRING METAL LEAF TO A SUBSTRATE

[76] Inventor: Richard Zemel, 1236 Harvey Rd., Knoxville, Tenn. 37922

[21] Appl. No.: 08/707,061

[22] Filed: Sep. 3, 1996

[51] Int. Cl.$^6$ .............. B32B 31/00; B44C 1/16
[52] U.S. Cl. .......... 156/233; 156/235; 156/241; 427/146
[58] Field of Search .................. 156/230, 235, 156/236, 233, 241, 277, 234; 427/208.4, 208.6, 146

[56] References Cited

U.S. PATENT DOCUMENTS

| | | | |
|---|---|---|---|
| 1,124,869 | 1/1915 | Davis et al. | |
| 3,340,121 | 9/1967 | Lawrenz | 156/233 |
| 3,458,376 | 7/1969 | Malik | 156/233 |
| 3,589,962 | 6/1971 | Bonjour | 156/233 |
| 4,012,552 | 3/1977 | Watts | 156/233 X |
| 4,142,929 | 3/1979 | Otomine et al. | 156/72 |
| 4,288,275 | 9/1981 | Davis | 156/233 X |
| 4,465,538 | 8/1984 | Schmoock | 156/233 |
| 4,685,984 | 8/1987 | Powers et al. | 156/155 |
| 4,810,320 | 3/1989 | Inagaki | 156/233 |
| 4,869,767 | 9/1989 | Robinson et al. | 156/233 |
| 4,994,131 | 2/1991 | Edwards | 156/233 |
| 5,133,819 | 7/1992 | Croner | 156/230 |
| 5,176,939 | 1/1993 | Shepherd | 427/208.6 X |
| 5,186,787 | 2/1993 | Phillips et al. | 156/631 |
| 5,306,374 | 4/1994 | Hambright | 156/247 |
| 5,383,996 | 1/1995 | Dressler | 156/234 |
| 5,487,927 | 1/1996 | Kamen et al. | 128/34.4 |
| 5,489,355 | 2/1996 | Shimizu et al. | 156/230 |
| 5,520,973 | 5/1996 | Kamen et al. | 428/35.7 |
| 5,603,259 | 2/1997 | Gross et al. | 156/233 X |

FOREIGN PATENT DOCUMENTS

| | | | |
|---|---|---|---|
| 1-93391 | 4/1989 | Japan | 156/233 |
| 1-145187 | 6/1989 | Japan | 156/233 |
| 4-38986 | 2/1992 | Japan | |

*Primary Examiner*—Curtis Mayes
*Attorney, Agent, or Firm*—Sofer & Haroun, LLP.

[57] ABSTRACT

A method of transferring metal leaf, such as gold leaf, to a substrate is disclosed. The method includes the steps of creating a transfer graphic design. After the transfer graphic design is created, a pressure sensitive adhesive design in the shape of the transfer graphic design is formed on a transfer sheet having paper backing and a release layer. The transfer sheet may be a dry transfer sheet or a water release decal type transfer sheet. The transfer sheet containing the pressure sensitive adhesive design is then placed on a substrate to which the pressure sensitive adhesive design is transferred by removing the transfer sheet so that the pressure sensitive adhesive design adheres to the substrate. Metal leaf is then applied to the pressure sensitive adhesive design.

9 Claims, 4 Drawing Sheets

METHOD OF TRANSFERRING METAL LEAF TO A SUBSTRATE

FIELD OF THE INVENTION

This invention relates to a method of transferring metal leaf to a substrate, and in particular, to creating a pressure sensitive adhesive in the shape of a graphic transfer, applying the transfer to the substrate and then applying the metal leaf to the adhesive on a substrate.

BACKGROUND OF THE INVENTION

Transfer size is used in the process of high quality leafing, such as gold leaf, bronze leaf or other forms of metal leaf, upon a substrate. Gold leaf, for instance, has been traditionally applied to interior and exterior surfaces by first applying a substance known as transfer size. Conventional transfer size is a sticky gluelike substance which can either be purchased or manufactured by the person performing the metal leafing. Transfer size is traditionally available in a slow type and a fast type. The difference between slow and fast size is the period of time necessary for the size to become tacky or to attain a desired stickiness. Fast size become tacky very quickly, but has a short "open" time or time during which it retains its stickiness. Slow size takes longer to become tacky but has a longer "open" time depending on the formulation of the size. Both fast and slow size are, however, applied as a wet substance which may be extremely messy. Transfer size is also available as an aerosol spray and generally tacks quickly. Spray transfer size may, however, run after sprayed upon the desired surface.

Size must be first applied wherever one would want to apply metal leaf. The size may be stenciled or painted on an object of substrate that is to receive the metal leaf. Generally, size is applied in register over an undercolor which gives character to the final leafing. However, the undercolor is often not visible because of the wetness of the size or the formulation of which it is composed. When the size is applied to an object or substrate and reaches the proper tack, the metal leaf is gently lowered on to the tacky size and very carefully smoothed over. A brush or fabric is then moved back and forth over the leaf such that the abrasive action causes the leaf not attached to the size to break away, leaving the areas coated in size to be metal leafed. Producing fine details using this method is, however, extremely difficult, time consuming, and requires a skilled artisan. Additionally, the chemicals and solvents used in the size formulation can be flammable and hazardous if used in a closed area, and in addition, may be harmful to the environment.

Accordingly, there is a need for a transfer size which is dry, clean, safe for both users and the environment, which is easy to prepare and which can be used by an individual with little or no training in the art of metal leafing.

OBJECTS AND SUMMARY OF THE INVENTION

It is thus a general object of the present invention to provide a metal leaf transfer size which is safe to use by a user as well as safe for the environment, and which permits high quality metal leafing by all individuals.

A more specific object of the present invention is to provide a transfer size which is dry and eliminates the need for application of a wet or spray size prior to applying metal leaf to a desired surface.

An additional object is to eliminate the use of graphic stencils which must be cut out or fabricated in order to apply wet or spray size in the desired areas.

A further object is to eliminate the hand painting of wet or spray size on a desired surface.

It is another object of the present invention to provide a dry transfer size which tacks quickly, has a relatively long "open" time, and which eliminates the mess associated with wet transfer size.

It is a further object of the present invention to provide a dry transfer size which is clear in color and which permits the addition of colored pigment for providing back up color.

It is still a further object of the present invention to provide a dry transfer size which is clear in color and which permits viewing of an undercolor on the substrate or surface to which the size is applied.

In accordance with one aspect of the present invention, a method of transferring metal leaf is provided which eliminates the need in the prior art for a wet or spray size to be applied prior to applying metal leaf to a substrate or surface.

The method of transferring metal leaf to a substrate according to the present invention, includes the steps of first creating a transfer graphic design. Next, utilizing a release sheet, which may be a dry release sheet or a water release decal type paper, a pressure sensitive adhesive design in the shape of the transfer graphic design is formed on the release sheet by a suitable process such as silk screening. The release sheet is allowed to dry and then allowed to cure. Use of the pressure sensitive adhesive is environmentally safe, and does not contain any harmful or flammable solvents or chemicals. After curing, the transfer sheet on which the transfer graphic is retained is placed against the substrate or surface upon which it is to be applied. If a dry transfer sheet is being used, the adhesive and graphic may be transferred to the substrate by rubbing the back of the transfer sheet. The transfer sheet is then removed to leave the adhesive on the substrate in the form of a dry transfer size. If a water release transfer paper is used, the back of the release paper is wet with water. After approximately one minute, the release paper is removed and the adhesive size which remains is allowed to dry. Metal leaf, such as gold leaf or bronze leaf or any other finely ground powder, pigment or even flock may then be applied in the traditional manner to the adhesive which is applied on the substrate.

The above description sets forth rather broadly the more important features of the present invention in order that the detailed description thereof that follows may be understood, and in order that the present contributions to the art may be better appreciated. Other objects and features of the present invention will become apparent from the following detailed description considered in conjunction with the accompanying figures. It is to be understood, however, that the figures are designed solely for the purposes of illustration and not as a definition of the limits of the invention, for which reference should be made to the appended claims.

BRIEF DESCRIPTION OF THE DRAWINGS

In the figures in which like reference characters denote similar elements throughout the several views.

DETAILED DESCRIPTION OF THE PRESENTLY PREFERRED EMBODIMENT

Figure 1:
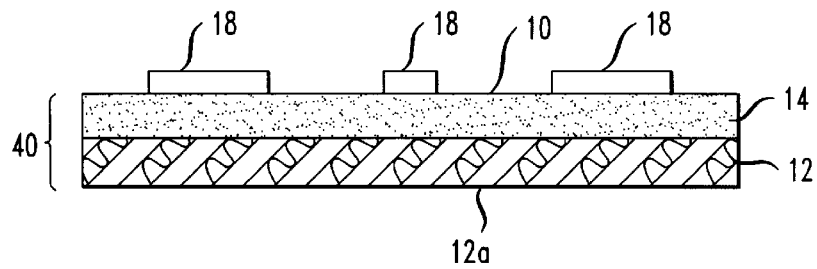
FIG. 1 illustrates a transverse sectional view of a transfer sheet having pressure sensitive adhesive disposed thereon for transferring a transfer graphic design to a substrate for application of metal leaf.

With reference to FIG. 1, there is shown one embodiment of the leaf adhesive transfer sheet 10 according to the present invention. Leaf adhesive transfer sheet 10 of the present invention comprises a design formed from a pressure sensitive adhesive 18 on a transfer sheet 40 having a paper backing 12 and a release layer 14. The preferred method of forming a design from pressure sensitive adhesive 18 on a transfer sheet 12 is illustrated in FIG. 4, wherein a graphic transfer design 16 must first be created, and which may be an illustrative design, a drawing or words such as a company name, for example. Graphic transfer design 16 is advantageously created using a computer system 22, although other methods such as stenciling may be used. Once the graphic transfer design 16 is created on the computer 22, a black film 24 having the desired design is created by printer means 26, such as an ink jet printer which is connected to the computer 22. Once the black film 24 is outputted from the printer means 26, the black film 24 is applied to a silk screen 28 with a photographic emulsion (not shown) so that wherever there is an image, the silk screen 28 is exposed or "burned in", thus creating a burned-in silk screen template 30 having small holes on the silk screen 28 which correspond to the graphic transfer design 16 created by computer 22. Since the words, drawing, or design created by the graphic transfer design 16 will later be attached to a substrate and viewed from in front of the substrate, the black film 24 is flipped or reversed before being placed on silk screen 28. Although, this is the preferred method of creating the graphic transfer design 16, any other method, as known by those skilled in the art of creating graphic transfers on a silk screen may be utilized such as hand painting, the scope of the invention not being limited to how graphic transfer design 16 is created on the silk screen.

The burned-in silk screen template 30 is then placed in a silk screen unit 32. A transfer sheet 40 having a paper backing 12 and a release layer 14 thereon is placed below the burned-in silk screen template 30. Thereafter, a pressure sensitive adhesive 18 is placed on top of the burned in silk screen 30 in the silk screen unit 32. The transfer sheet 40 is then silk screened allowing the pressure sensitive adhesive 18 to flow through the small holes in the burned in silk screen 30 template. Accordingly, adhesive 18 is screen printed onto release layer 14 of transfer sheet 40 in the shape of graphic transfer design 16 which was originally created by computer 22 and printed by printer means 26.

Pressure sensitive adhesive 18 is preferably an automotive pressure sensitive adhesive such as ESPS 500, manufactured by Electrocal, S. Windsor, Conn. 06074. However, the invention is not limited in this respect and other contact adhesives may be used. Adhesive 18 is preferably thinned up to 20% with water and is clear in color so that one may inspect the graphic transfer. Advantageously, the pressure sensitive adhesive may be colored with water soluble pigments to provide a backup color for use in the later addition of metal leaf as well as to ensure that the adhesive is visible on transparent surfaces. Transfer sheet 40 upon which graphic transfer design 16 is placed, is preferably any dry transfer sheet known in the art such as Chromaslick brand release paper from Chromotek Inc., 196 Wicksteed Ave., Toronto, Ontario M4G 286. As an alternative, a water release decal type transfer sheet such as Twincal and Photocal manufactured by Brittains T.R. Limited—Ivy House Paper Mills, Commercial Road, Hanley, Stakeon-Tret ST1 3QS, England, and described in U.S. application Ser. No. 08/654,448 to Zemel filed May 28, 1996, now abandoned, the disclosure of which is incorporated herein by reference, may be used instead of a dry transfer sheet.

The method of transferring metal leaf to a substrate comprises the steps of first creating the graphic transfer design 16 on a computer 22 as discussed hereinabove. Next, a design comprised of pressure sensitive adhesive 18 in the shape created by transfer graphic design 16 is formed on release layer 14 of transfer sheet 40 according to the silk screening procedure discussed hereinabove. The forming step further comprises the step of drying adhesive 18 and transfer sheet 40 for about 20 seconds after adhesive 18 has been screen printed on to transfer sheet 40, and then allowing transfer sheet 40 and adhesive 18 to cure in open air, such as on a table, for 24–48 hours. A conventional hair dryer is preferably used for drying adhesive 18 and transfer sheet 40, although other methods of drying may be used.

Figure 3:
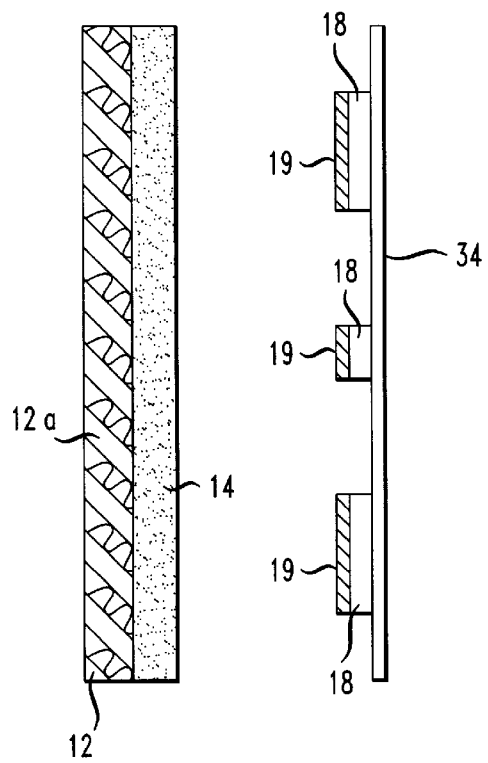
FIG. 3 illustrates an exploded side view of the transfer graphic design adhered to a substrate after removal of the release paper.
Figure 4A:
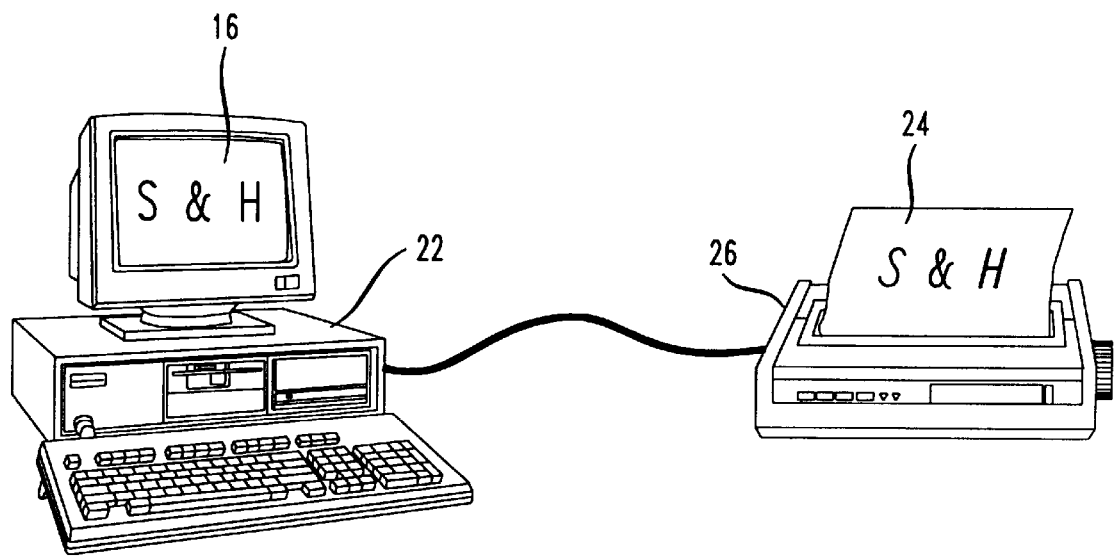
FIG. 4 illustrates a schematic illustration of the preferred process for creating a transfer graphic design and printing it on a transfer sheet according to the present invention.
Figure 4B:
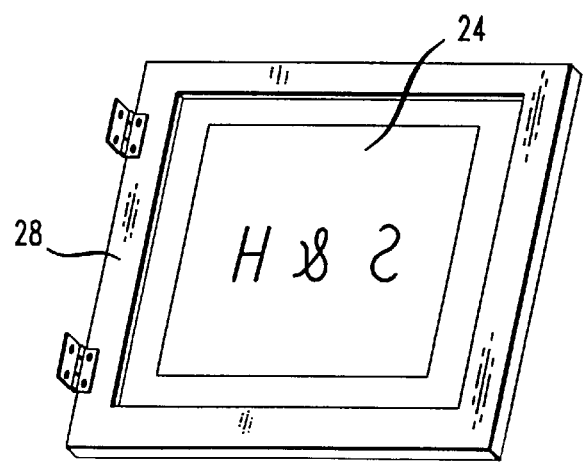
Figure 4C:
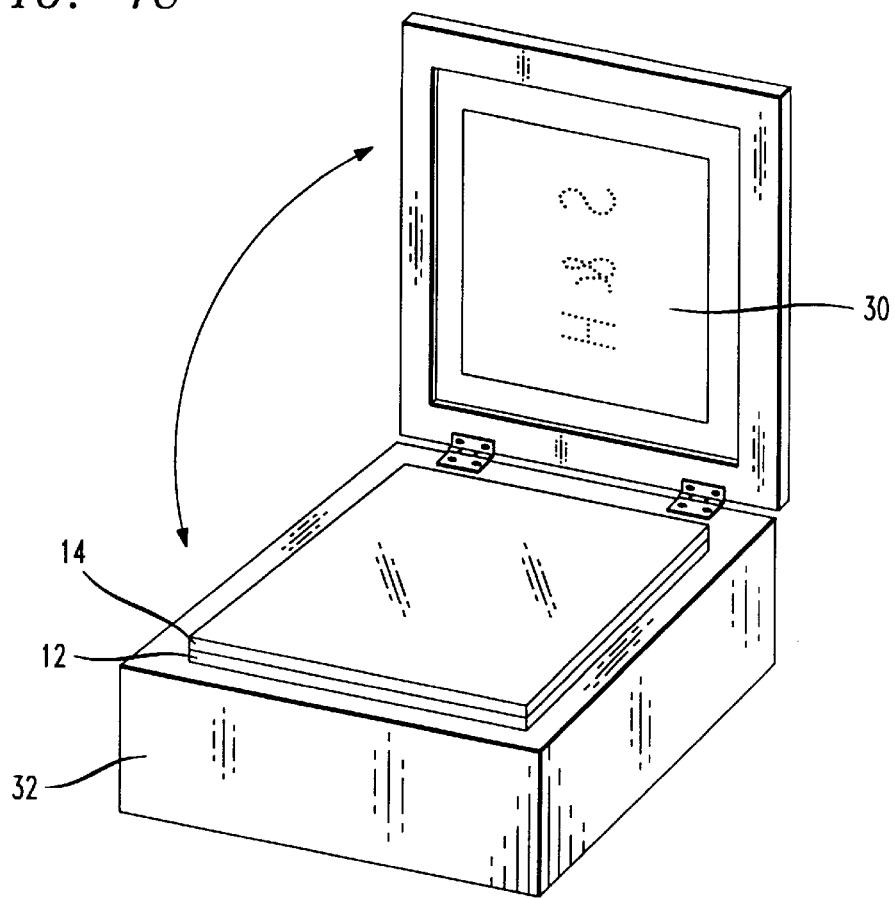
Figure 4D:
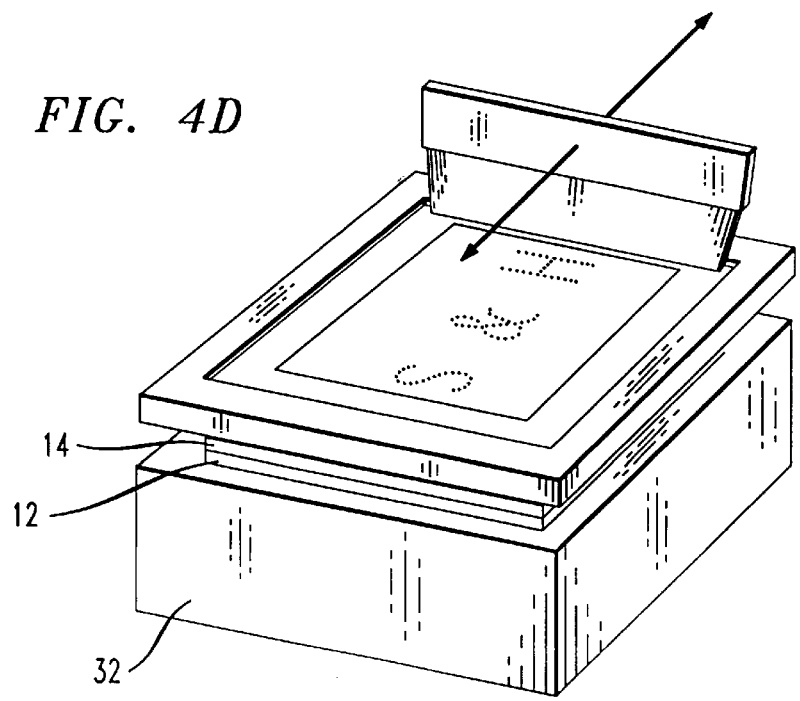
Figure 4E:
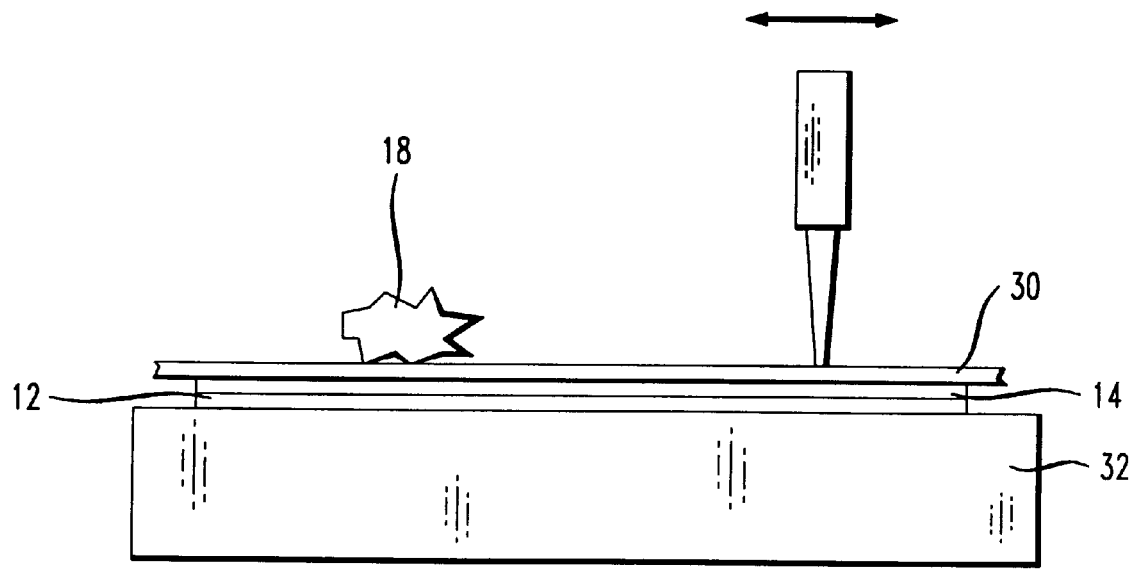
Figure 4F:
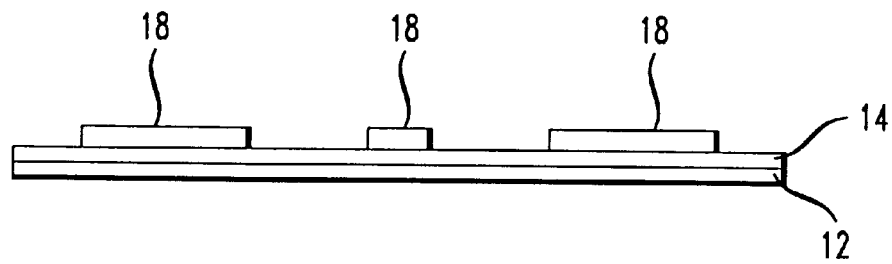

After the forming step is completed, transfer sheet 40 having the adhesive 18 thereon, is placed on a substrate 34, as illustrated in FIG. 3. If Chromaslik or another brand of dry transfer sheet 40 is used, the transfer sheet 40 with adhesive 18 thereon is placed upon a substrate 34 or surface with adhesive 18 facing the substrate 34. The reverse side or back 12a of paper backing 12 is then rubbed or brushed with a burnisher (not shown). Other objects such as a finger nail may also be used. Paper backing 12 is then peeled away leaving adhesive 18 on substrate 34. Adhesive 18 shaped in the design created by design transfer graphic 16 is now prepared for the application of metal leaf (not shown) thereon. If adhesive 18 was screen printed onto a water release decal type transfer sheet 40, the water release decal type transfer sheet 40 is pressed onto the desired substrate 34 or surface after having been dried and allowed to cure. While pressed against the substrate 34 for transfer, reverse side or back 12a of water release decal type transfer sheet 40 is wetted with water. After about one minute, the water release decal type transfer sheet 40 is removed and the adhesive 18 which remains upon the substrate 34 is allowed to dry without handling for approximately 15–20 minutes. After adhesive 18 has dried, metal leaf 19 may be applied thereto. Accordingly, metal leaf 19, such as gold leaf or bronze leaf or any other finely ground powder, pigment or even flock may then be applied in the traditional manner to the adhesive 18 which subsists on the substrate 34.

Figure 2:
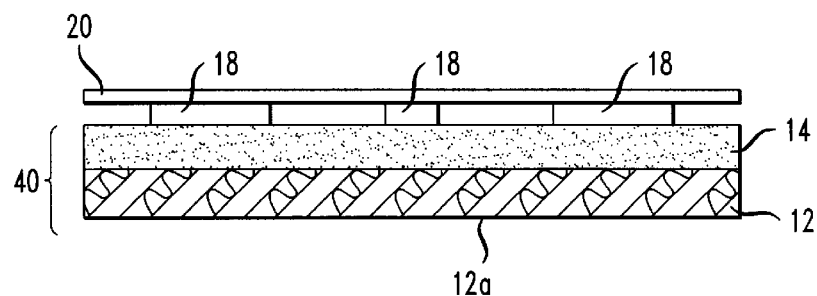
FIG. 2 illustrates a transverse sectional view of a transfer sheet having pressure sensitive adhesive disposed thereon for transferring a transfer graphic design to a substrate and having a protective sheet covering the transfer graphic design for storage or shipping.

It is to be noted that transfer sheet 40 with adhesive 18 need not be immediately transferred to a substrate after drying with the hair dryer. Instead, transfer sheet 40 with adhesive 18 thereon may be covered with a protective sheet 20, as shown in FIG. 2, for storage and later usage. Protective sheet 20 may be a wax sheet, a silicon sheet, or a parchment sheet. Furthermore, after metal leaf has been applied to adhesive 18 on the substrate, a non-solvent based top coat may be applied thereto to protect bronze or copper leaf.

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto. It is to be understood that the figures are not necessarily drawn to scale, but that they are merely conceptual in nature.

I claim:

1. A method of transferring metal leaf to a substrate, comprising the steps of:

creating a transfer graphic design;

forming on a water release decal type transfer sheet, the transfer sheet having a backing and a release layer, a pressure sensitive adhesive design in the shape of said transfer graphic design;

placing said transfer sheet containing said pressure sensitive adhesive design on a substrate;

transferring said pressure sensitive adhesive design by removing said transfer sheet so that said pressure sensitive adhesive design adheres to said substrate; and applying metal leaf to said pressure sensitive adhesive design on said substrate.

2. The method of transferring metal leaf to a substrate as recited in claim 1, wherein said metal leaf is gold leaf.

3. A method of transferring metal leaf to a substrate, comprising the steps of:

creating a transfer graphic design;

forming on a transfer sheet, having a backing and a release layer, a pressure sensitive adhesive design in the shape of said transfer graphic design by placing a burned-in silk screen template in a silk screen unit, placing the transfer sheet below said burned-in silk screen template, placing a pressure sensitive adhesive on top of the burned-in silk screen template, and silk screening said transfer sheet by allowing said pressure sensitive adhesive to flow through small holes in the burned-in silk screen templates;

placing said transfer sheet containing said pressure sensitive adhesive design on a substrate;

transferring said pressure sensitive adhesive design by removing said transfer sheet so that said pressure sensitive adhesive design adheres to said substrate; and applying metal leaf to said pressure sensitive adhesive design on said substrate.

4. A method of creating a graphic design, comprising the steps of:

creating a graphic design on a computer system;

creating the computer graphic design or a template;

forming on a transfer sheet having a backing and a release layer a pressure sensitive adhesive design in the shape of said graphic design on said template so that when said transfer sheet containing said pressure sensitive adhesive design is placed on a substrate, said pressure sensitive adhesive design is transferred by removing said transfer sheet so that said pressure sensitive adhesive design adheres to said substrate thereby allowing the application of metal leaf to said pressure sensitive adhesive design on said substrate.

5. The method as recited in claim 1, wherein said pressure sensitive adhesive is colored with a water suluble pigment.

6. The method as recited in claim 1, wherein said transfer sheet is a water release decal type transfer sheet.

7. The method as recited in claim 1, wherein said metal leaf is gold leaf.

8. The method as recited in claim 1, wherein said template is porous thus allowing the pressure sensitive adhesive to be applied through said template and onto said transfer sheet.

9. The method as recited in claim 8, wherein said pressure sensitive adhesive is silk screened through said template and onto said transfer sheet.

* * * * *